(12) United States Patent
Williams

(10) Patent No.: US 6,212,652 B1
(45) Date of Patent: Apr. 3, 2001

(54) CONTROLLING LOGIC ANALYZER STORAGE CRITERIA FROM WITHIN PROGRAM CODE

(75) Inventor: Emrys J. Williams, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/193,996

(22) Filed: Nov. 17, 1998

(51) Int. Cl.[7] ........................................... G06F 11/00
(52) U.S. Cl. ................................. 714/37; 714/25
(58) Field of Search ........................ 714/37, 5, 7, 15, 714/25, 26, 29, 31, 33, 38, 47; 707/10, 103

(56) References Cited

U.S. PATENT DOCUMENTS

| | | | |
|---|---|---|---|
| 5,067,130 | * 11/1991 | Jackson | 371/22.1 |
| 5,611,044 | * 3/1997 | Lundeby | 395/183.14 |
| 5,701,486 | * 12/1997 | Gilbertson et al. | 395/704 |
| 5,903,759 | * 5/1999 | Sun et al. | 395/704 |
| 5,991,899 | * 11/1999 | Deacon | 714/37 |
| 6,016,563 | * 1/2000 | Fleischer | 714/725 |
| 6,023,561 | * 2/2000 | Mann | 395/183.21 |

\* cited by examiner

Primary Examiner—Nadeem Iqbal
(74) Attorney, Agent, or Firm—Park & Vaughan LLP

(57) ABSTRACT

A system that allows a programmer to insert instructions into a computer program that change criteria used by a logic analyzer to gather data. This criteria may include, a qualifier, which is used to filter data gathered by the logic analyzer, or a trigger condition that is used by the logic analyzer to decide when to take a snapshot of the data. This system operates by configuring the logic analyzer to change its criterion for recording data when an instruction in the computer program is executed that communicates with the logic analyzer. The system additionally provides special programming language instructions, which communicate with the logic analyzer. By inserting the special instructions into a computer program, a programmer can select the criterion that the logic analyzer uses to gather data at key points in a computer program. This allows the programmer to specify how data is to be collected by the logic analyzer in different sections of code. Using this technique, a programmer can greatly reduce the amount of unnecessary data that is collected by the logic analyzer, and can thereby make better use of the limited data storage space available within the logic analyzer.

22 Claims, 5 Drawing Sheets

```
#define IO_ONLY      0
#define NOTHING      1
#define ALL          2
#define LA_SWITCH(x)       \
      *(la_switch_location+x)=0;
              •
              •
              •
read
write
add
write
LA_SWITCH(NOTHING);
for(p=io_mem_add ; p<=io_mem_top; p++)
      clear_io_mem(p);
LA_SWITCH(ALL);
read
write
              •
              •
              •
```

FIG. 3A

```
#define LA_SWITCH(x)       \
      *la_switch_location=x;
```

FIG. 3B

```
#define IO_ONLY        0
#define NOTHING        1
#define ALL            2
#define LA_INT_SWITCH(x)        \
        *la_switch_location;    \
        *la_switch_location=x;
                •
                •
                •
interrupt:
        temp=LA_INT_SWITCH(ALL);
                •
                •
                •
        (interrupt code)
                •
                •
                •
        LA_INT_SWITCH(temp);
        return;
```

FIG. 4

CONTROLLING LOGIC ANALYZER STORAGE CRITERIA FROM WITHIN PROGRAM CODE

BACKGROUND

1. Field of the Invention

The present invention relates to logic analyzers for analyzing program execution in computer systems. More specifically, the present invention relates to a method and apparatus for embedding commands within a computer program that change a criterion for storing data in a logic analyzer.

2. Related Art

Logic analyzers are commonly used by computer system developers to debug computer hardware and software. Logic analyzers operate by periodically capturing the state on a set of signal lines in a digital system, such as a computer, with reference to a time base, such as a system clock. A logic analyzer typically "triggers" when it encounters a preselected pattern on the set of signal lines. Triggering causes the logic analyzer to take a snapshot of a set of data patterns immediately preceding and/or following the particular pattern—or trigger point. This allows a developer to view events surrounding the trigger point.

One problem with using logic analyzers is that they commonly record large volumes of data, which can be cumbersome to store and manipulate. Because a logic analyzer typically contains a limited amount of memory for storage, recording a significant volume of data from the execution stream of a computer program can quickly overrun the logic analyzer's internal storage capacity. This is especially true for logic analyzers that are embedded within computer systems for fault-tolerance purposes. Such embedded logic analyzers tend to be small and inexpensive. Hence, they typically include a limited amount of memory for storage of data.

Even if a logic state analyzer can successfully record a large volume of data into a large file, the task of manipulating the large file to analyze the data can be a slow and cumbersome process. Simply reading the large file from disk, and possibly sending it across a computer network, can take many minutes, and possibly hours. Furthermore, analyzing the large volume of data can consume a large amount of processor time.

Fortunately, much of the data recorded by a logic analyzer is not relevant in diagnosing a system error. Programs typically execute many repetitive loops that perform simple tasks, such as initializing an array. Function calls and returns require a tremendous number of instructions to save and restore state and to pass parameters.

In order to remove some of this irrelevant data, some logic analyzers provide qualifiers that can be used to filter input data patterns. For example, a qualifier might specify that only write operations are to be recorded. Some logic analyzers can be programmed to change these qualifiers upon the occurrence of certain input patterns.

Using qualifiers can somewhat reduce the number of input patterns recorded by a logic state analyzer. However, a developer programming a logic analyzer to gather data typically has limited insight into how to filter out irrelevant data. A programmer actually viewing the code before it is executed typically has more insight into which portions of the code are likely to create important input patterns. Hence, it is desirable to give the application programmer some measure of control over what types of qualifiers or trigger conditions are to be used to gather data from certain portions of code.

Such control over the internal operation of a logic analyzer is presently not possible from within existing programming languages. Sometimes programmers augment code to embed a special trigger command in a program. When the trigger command is executed, it causes the logic analyzer to take a snapshot of the input data stream. Programmers have also augmented code with commands that embed "markers" into the data stream generated by the program. A marker command typically causes a write to a specific I/O locations, which creates an easily identifiable input pattern for the logic analyzer. Thus, a programmer can insert marker commands into a program to identify specific program locations, such as the start and the end of an interesting piece of code.

Unfortunately, none the above-mentioned programming language features allow a programmer to explicitly control what type of data is gathered, and what trigger conditions are used in different sections of code.

SUMMARY

One embodiment of the present invention provides a system that allows a programmer to insert instructions into computer code that change criteria used by a logic analyzer to gather data. The critera may include a qualifier, which is used to filter data gathered by the logic analyzer, or a trigger condition that is used by the logic analyzer to decide when to take a snapshot of the data. This system operates by configuring the logic analyzer to change its criterion for recording data when an instruction in the computer program is executed that communicates with the logic analyzer. The system additionally provides special programming language instructions, which communicate with the logic analyzer. By inserting the special instructions into a computer program, a programmer can select the criterion that the logic analyzer uses to gather data at key points in a computer program. This allows the programmer to specify how data is to be collected by the logic analyzer in different sections of code. Using this technique, a programmer can greatly reduce the amount of unnecessary data that is collected by the logic analyzer, and can thereby make better use of the limited data storage space available within the logic analyzer.

BRIEF DESCRIPTION OF THE FIGURES

FIG. 3A illustrates the use of macro to access a reserved location in accordance with an embodiment of the present invention.

FIG. 3B illustrates an alternative macro in accordance with an embodiment of the present invention.

FIG. 4 illustrates how instructions can be recorded within an interrupt in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs, and computer instruction signals embodied in a carrier wave.

Computer System

Figure 1:
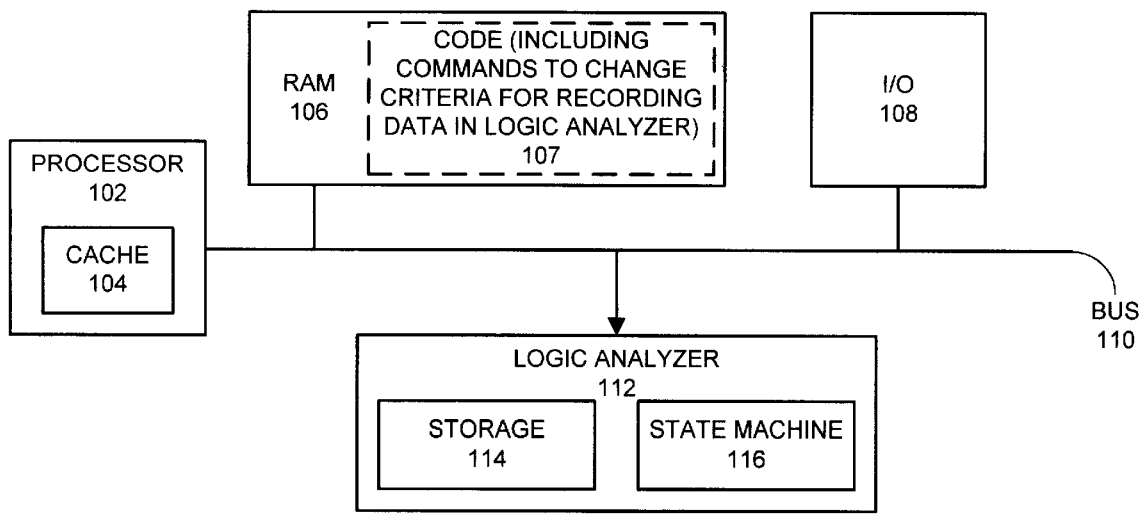
FIG. 1 illustrates a computer system including an attached logic analyzer in accordance with an embodiment of the present invention.

FIG. 1 illustrates a computer system including an attached logic analyzer 112 in accordance with an embodiment of the present invention. The computer system illustrated in FIG. 1 includes processor 102, which is coupled to RAM (Random Access Memory) 106 and I/O unit 108 through bus 110. Processor 102 may include any type of computing device that is capable of processing code and/or data. This includes, but is not limited to, a mainframe processor, a multiprocessor system, a microprocessor, a device controller, and a computing unit within an appliance (such as a toaster). Processor 102 includes a cache 104, which stores code and/or data for use by processor 102. Note that cache 104 intercepts memory references that would normally flow across bus 110 to RAM 106. Hence, many memory references within processor 102 do not result in traffic across bus 110. Bus 110 may be any type of communication channel that can be used to transfer code and/or data between processor 102 and RAM 106. This includes, but is not limited to, electrical, infrared, radio wave and optical communication channels.

RAM 106 and storage 114 may include any memory. This includes, but is not limited to, random access memory, flash memory, magnetic storage devices and optical storage devices. RAM 106 includes code 107, which contains commands to change criteria for recording data in logic analyzer 112. This code is described in more detail below with reference to FIGS. 3–5.

I/O unit 108 receives and processes I/O requests from processor 102. I/O unit 108 may include any device that resides in the I/O space of a computer system. This includes, but is not limited to data storage devices, such as a disk drive or a tape drive, as well as data input devices, such as a keyboard or a mouse. Note that bus 110 can transfer memory requests between processor 102 and RAM 106, as well as I/O requests between processor 102 and I/O unit 108. However, the present invention is not limited to systems that accommodate both processor and I/O traffic. In general, the present invention may apply to any system that executes a computer program.

Logic analyzer 112 is coupled to bus 110, so that logic analyzer 112 can record address signals, data signals, and other signal lines on bus 110. In general, logic analyzer 112 may be coupled to any signal lines in the computer system. The choice of what signals lines to connect to logic analyzer 112 depends upon the type of diagnosis to be performed.

Logic analyzer 112 may include any type of data gathering unit that is capable of capturing and recording the state of a set of digital signal lines on successive clock cycles. In one embodiment, logic analyzer 112 is coupled to bus 110 through a plurality of inputs that are coupled to address, data and arbitration lines on bus 110. In one embodiment of the present invention, logic analyzer 112 is a stand-alone logic analyzer, which is temporarily coupled to the computer system through a set of detachable probes. In another embodiment, logic analyzer 112 is embedded within the computer system as part of a fault-tolerance feature of the computer system. This type of embedded logic analyzer may be programmed automatically to diagnose a problem in the computer system, thereby allowing the computer system automatically to take corrective action in the case of a system error.

Logic analyzer 112 includes storage 114 and state machine 116. Storage 114 is a memory that is used to store input data patterns gathered from bus 110. To this end, storage 114 may include any combination of volatile and non-volatile storage devices. For example, storage 114 may include random access memory and flash memory, as well as magnetic and optical storage devices.

State machine 116 controls the operation of logic analyzer 112. Each state within state machine 116 is associated with a different "criterion" for gathering data. A "criterion" may include qualifiers for filtering input data. For example, a qualifier may specify that the logic analyzer should record only read accesses. Another criterion might specify that the logic analyzer should record only write accesses. Yet another criterion might specify that the logic analyzer should record only I/O references. In general a criterion may specify any condition that can be used to filter the input data.

A criterion may also include a trigger condition, which specifies how and when a logic analyzer takes a snapshot the input data. This may include specifying what types of input patterns the logic analyzer triggers off of, as well as specifying the position and size of the trigger window relative the trigger point. A particular configuration for a state machine is described in more detail below with reference to FIG. 2B.

Logic Analyzer State Diagram

Figure 2A:
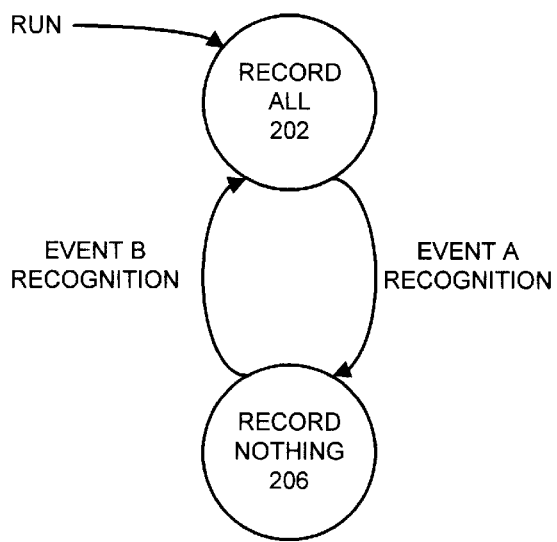
FIG. 2A illustrates a state diagram for a conventional logic analyzer.

FIG. 2A illustrates a state diagram for a conventional logic analyzer. The state diagram in FIG. 2A includes two states. In state 202, the logic analyzer records all input data. In state 206, the logic analyzer records nothing. Upon recognizing event A, the logic analyzer moves between states 202 and 206. Upon recognizing event B, the logic analyzer moves from state 206 to state 202.

Events A and event B may include any events that occur on the inputs to, or are otherwise communicated to, the logic analyzer. For example, an event can be a particular pattern (or word) on the inputs to the logic analyzer. This may include patterns on address and data lines of a computer system, as well as patterns on other types of lines from which data is not typically gathered, such as interrupt lines and system reset lines. An event may also be series of consecutive patterns (or words) on the input lines. Alternatively, an event may occur on an input to the logic analyzer that is not part of the data inputs that the logic analyzer records data from, for example, a logic analyzer input that exists purely for control purposes.

Note that the logic analyzer typically does not capture data for later analysis until a trigger condition takes place. When the trigger condition takes place, a fixed size window of data is captured for later analysis.

Figure 2B:
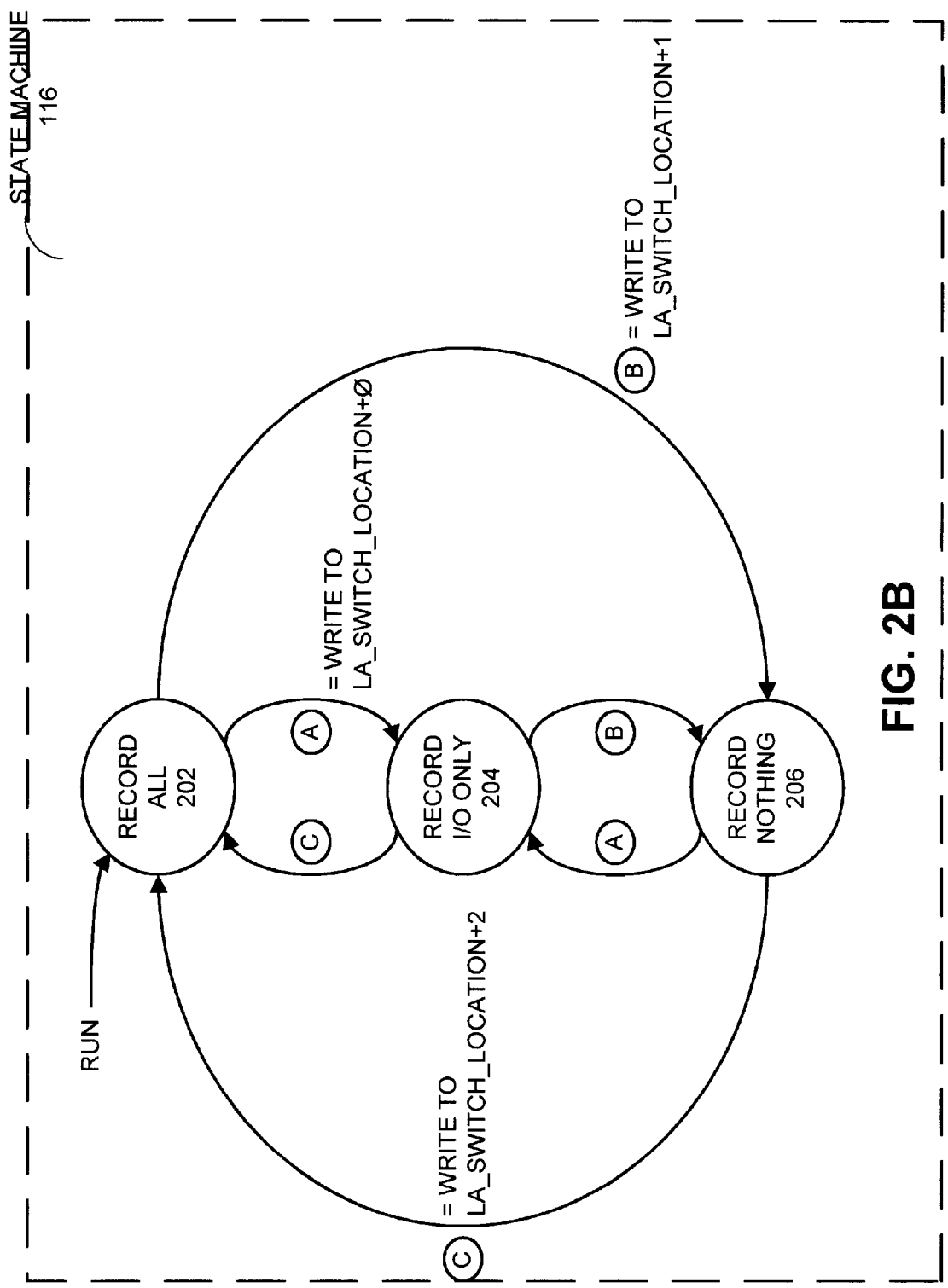
FIG. 2B illustrates a state diagram for controlling criteria for recording data within a logic analyzer in accordance with an embodiment of the present invention.

In contrast, FIG. 2B illustrates an example of a state diagram that controls criteria for recording data within a logic analyzer in accordance with an embodiment of the present invention. This state diagram may be created in a number of ways. In one embodiment of the present invention, the state diagram is specified by a human operator of the logic state analyzer. In another embodiment, the logic analyzer is embedded in the computer system, and a representation of the state diagram loaded into the logic analyzer during system boot up. In yet another embodiment, a representation of the state diagram is pre-installed in a non-volatile memory within the logic analyzer.

The state diagram illustrated in FIG. 2B includes three states, which correspond to three different qualifiers for recording input data. In state 202, logic analyzer 112 records all input data. In state 204, logic analyzer 112 records only I/O requests. In state 206, logic analyzer 112 records none of the input data stream. Note that although data is continuously recorded by logic analyzer 112, this data is not available for analysis until a trigger condition occurs in the input data stream.

Logic analyzer 112 transitions between different states upon encountering accesses to reserved locations. When logic analyzer 112 encounters a write to "LA_SWITCH_LOCATION+0," state machine 116 transitions to state 204. In state 204, logic analyzer 112 records only I/O requests. These transitions are indicated by the label "A" on arcs in FIG. 2B. When logic analyzer 112 encounters a write to "LA_SWITCH_LOCATION+1," state machine 116 transitions to state 206, in which logic analyzer 112 records nothing. These transitions are indicated by the label "B" on arcs in FIG. 2B. When logic analyzer 112 encounters a write to "LA_SWITCH_LOCATION+2," state machine 116 transitions to state 206, in which logic analyzer 112 records all input patterns. These transitions are indicated by the label "C" on arcs in FIG. 2B.

Code Example

FIG. 3A illustrates the use of macro to access a reserved location in accordance with an embodiment of the present invention. The code in FIG. 3A is divided into two segments.

The first segment defines offsets for the macro. As illustrated in FIG. 2B, an offset of zero causes a transition to state 204, in which only I/O request are recorded; an offset of one causes a transition to state 206, in which nothing is recorded; and an offset of two causes a transition to state 202, in which all input data is recorded. To this end, the code defines the label "IO_ONLY" to correspond to the value zero, the label "NOTHING" to correspond to the value one, and the label "ALL" to correspond to the value two. Next, the code defines a macro that converts "LA_SWITCH(X)" into "*la_switch_location+X".

The second segment illustrates how the macro is used in a body of code. This code includes various read and write instructions as well as a "for" loop. If the programmer wishes to exclude the "for" loop from recording by the logic analyzer, the programmer simply brackets the "for" loop with "LA_SWITCH" macros. This first LA_SWITCH macro causes a write to reserved location la_switch_location+1. This causes state machine 116 in FIG. 2B to transition to state 206, in which nothing is recorded. The second LA_SWITCH macro causes a write to reserved location la_switch_location+2. This causes state machine 116 in FIG. 2B to transition to state 202, in which all data patterns are recorded. In this way the programmer is able to exclude the "for" loop from being recorded by the logic analyzer. As is illustrated in FIG. 2B, this technique can dramatically reduce the amount of data that is recorded by logic analyzer 112.

FIG. 3B illustrates an alternative macro in accordance with another embodiment of the present invention. In this embodiment, the invention uses only a single reserved location, and the different state transitions are signaled by different values written to the reserved location. This requires the state machine within logic analyzer 112 to be programmed to make transitions based upon data patterns transferred to the reserved location, instead of making transitions based upon which reserved locations are accessed.

Interrupt Example

FIG. 4 illustrates how instructions can be recorded within an interrupt in accordance with an embodiment of the present invention. In this example, the state transitions depend upon which values are sent to the reserved address, instead of which reserved address is accessed (as in FIG. 2B). The state diagram for this example is the same as the state diagram illustrated in FIG. 2, except that the transitions to states 202, 204 and 206 occur when the values two, zero and one, respectively, are written to "la_switch_location."

As in FIG. 3A, the code in FIG. 4 is divided into two segments. The first segment defines values for the macro. The label "IO_ONLY" corresponds to the value zero, the label "NOTHING" corresponds to the value one and the label "ALL" corresponds to the value two. Next, the code defines a macro that converts "LA_INT_SWITCH(X)" into "*la_switch_location; *la_switch_location=X".

The second segment illustrates how the macro is inserted into an interrupt. At the beginning of the interrupt, a temp variable is set to LA_INT_SWITCH(X). This causes the current value stored in la_switch_location to be recorded into the temp variable, and the value X to be written to la_switch_location. At the end of the interrupt code, LA_INT_SWITCH is called again with temp as an input. This causes the value stored in temp to be restored to la_switch_location. In this way, the logic analyzer is restored to the state it was in before the interrupt was called. This scheme allows potentially interesting operations of the interrupt routine to be recorded by the logic analyzer despite the normal code having turned off logic analyzer storage.

Configuration and Recording Process

Figure 5:
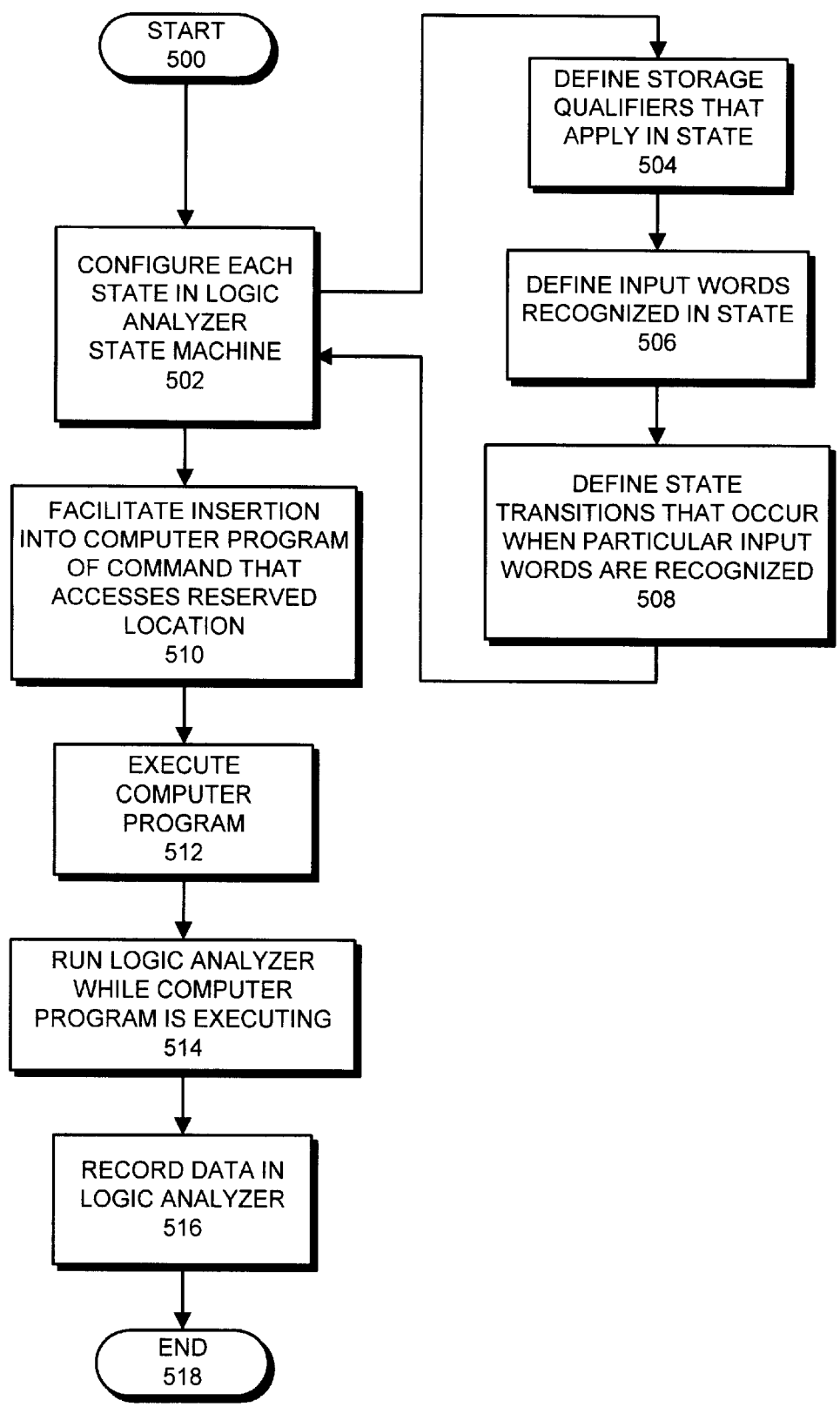
FIG. 5 is a flow chart illustrating the process of configuring and using the logic analyzer in accordance with an embodiment of the present invention.

FIG. 5 is a flow chart illustrating the process of configuring and using logic analyzer 112 in accordance with an embodiment of the present invention. First, each relevant state in the logic analyzer state machine is configured (step 502). This process is illustrated in more detail in steps 504, 506 and 508. The system first defines storage qualifiers that apply to each state (step 504). As mentioned above, such qualifiers may specify that only read, only write or only I/O references are to be recorded. In general, such qualifiers may specify any other conditions that the logic analyzer can discriminate between. Next, a set of input words that are recognized in the state are defined (step 506). Finally, state transitions that occur when particular input words are recognized are defined (step 508). As mentioned above, this programming can be accomplished manually by a human user, or automatically during system boot up. Alternatively, the logic analyzer can be pre-programmed with the desired state machine.

After the logic analyzer is programmed, the system allows the programmer to insert into the code special commands that reference reserved locations (step 510). Next, the computer program is executed (step 512), and the systems runs the logic analyzer while the computer program is executing (step 514). This sets into motion a process that records data in the logic analyzer (step 516). Once this data is recorded, it can be used to diagnose the cause of problems that arise during execution of the computer program.

Although the described embodiment uses special commands that reference reserved locations to transmit a signal between the processor and the logic analyzer to change storage qualifiers, in general, a number of different types of special commands can be used. For example, any command that generates an identifiable bus cycle can be used, or any command that can change the state of bits on an I/O port.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for recording data in a logic analyzer, comprising:
    configuring the logic analyzer to change a criterion for recording data upon execution of commands that communicate with the logic analyzer;
    facilitating insertion into a computer program of at least one command that communicates with the logic analyzer;
    executing the computer program on the computer system;
    running the logic analyzer while the computer program is executing so that the criterion for recording the data changes upon execution of the at least one command that communicates with the logic analyzer; and
    recording data in the logic analyzer based upon the criterion.

2. The method of claim 1, wherein the criterion for recording the data specifies a qualifier for filtering the data to be recorded.

3. The method of claim 1, wherein the criterion for recording the data specifies a condition for triggering the logic analyzer.

4. The method of claim 1, wherein the at least one command that communicates with the logic analyzer writes a value that specifies the criterion for recording the data to a reserved location.

5. The method of claim 1, wherein the at least one command that communicates with the logic analyzer accesses a reserved location, which is a member of a set of reserved locations, wherein different reserved locations in the set specify different criteria for recording the data.

6. The method of claim 1, wherein the configuring of the logic analyzer takes place upon system boot up.

7. The method of claim 1, wherein the configuring of the logic analyzer takes place under manual control by a human operator.

8. The method of claim 1, wherein the logic analyzer operates as part of a fault-tolerance mechanism in the computer system.

9. The method of claim 1, wherein the at least one command that communicates with the logic analyzer is a write operation.

10. A computer readable storage medium storing instructions that when executed by a computer cause the computer to perform a method for recording data in a logic analyzer, comprising:
    configuring the logic analyzer to change a criterion for recording data upon execution of commands that communicate with the logic analyzer;
    facilitating insertion into a computer program of at least one command that communicates with the logic analyzer;
    executing the computer program on the computer system;
    running the logic analyzer while the computer program is executing so that the criterion for recording the data changes upon execution of the at least one command that communicates with the logic analyzer; and
    recording data in the logic analyzer based upon the criterion.

11. A computer system including a logic analyzer for diagnostic purposes, comprising:
    a logic analyzer embedded in the computer system, which is configured to change a criterion for recording data in the logic analyzer upon detecting a command that communicates with the logic analyzer;
    an execution mechanism that executes the computer program;
    a controller that causes the logic analyzer to run while the computer program is executing so that the criterion for recording the data changes upon execution of the at least one command that communicates with the logic analyzer; and
    a recording mechanism, within the logic analyzer, that records data based upon the criterion.

12. The apparatus of claim 11, further comprising a program editor, within the computer system, that facilitates insertion into a computer program of at least one command that communicates with the logic analyzer.

13. The computer system of claim 11, wherein the criterion for recording the data specifies a qualifier for filtering the data to be recorded.

14. The computer system of claim 11, wherein the criterion for recording the data specifies a condition for triggering the logic analyzer.

15. The computer system of claim 11, wherein the at least one command that communicates with the logic analyzer writes a value that specifies the criterion for recording the data to a reserved location.

16. The computer system of claim 11, wherein the at least one command that communicates with the logic analyzer accesses a reserved location, which is a member of a set of reserved locations, wherein different reserved locations in the set specify different criteria for recording the data.

17. The computer system of claim 11, further comprising a configuration mechanism that configures the logic analyzer during system boot up.

18. The computer system of claim 11, further comprising a configuration mechanism that configures the logic analyzer based upon manual commands entered by a human operator.

19. The computer system of claim 11, wherein the controller is configured to operate the logic analyzer as part of a fault-tolerance mechanism in the computer system.

20. The computer system of claim 11, wherein the at least one command that communicates with the logic analyzer is a write operation.

21. A computer system including a logic analyzer for diagnostic purposes, comprising:
    a logic analysis means, embedded in the computer system and configured to change a criterion for recording data in the logic analyzer upon detecting a command executed by the computer system that communicates with the logic analysis means;
    an execution means, for executing the computer program;
    a controller means for causing the logic analyzer to run while the computer program is executing so that the criterion for recording the data changes upon execution of the at least one command that communicates with the logic analysis means; and
    a recording means, within the logic analyzer, for recording data based upon the criterion.

22. The apparatus of claim 21, further comprising a program editing means, within the computer system, that facilitates insertion into a computer program of at least one command that communicates with the logic analyzer.

* * * * *